(12) United States Patent
Ahn et al.

(10) Patent No.: US 10,111,352 B2
(45) Date of Patent: Oct. 23, 2018

(54) DISPLAY UNIT AND DISPLAY DEVICE INCLUDING THE SAME

(71) Applicant: SAMSUNG ELECTRONICS CO., LTD., Suwon-si (KR)

(72) Inventors: Joon Seok Ahn, Suwon-si (KR); Jeong Il Kang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 84 days.

(21) Appl. No.: 14/924,913

(22) Filed: Oct. 28, 2015

(65) Prior Publication Data

US 2016/0324027 A1  Nov. 3, 2016

(30) Foreign Application Priority Data

Apr. 30, 2015 (KR) .................. 10-2015-0061726

(51) Int. Cl.
| | |
|---|---|
| *G06F 1/16* | (2006.01) |
| *H05K 7/02* | (2006.01) |
| *H05K 1/14* | (2006.01) |
| *H05K 5/00* | (2006.01) |

(Continued)

(52) U.S. Cl.
CPC ............... *H05K 7/02* (2013.01); *H05K 1/147* (2013.01); *G06F 1/1616* (2013.01); *G06F 1/1683* (2013.01); *H05K 1/189* (2013.01); *H05K 2201/05* (2013.01); *H05K 2201/056* (2013.01); *H05K 2201/09063* (2013.01); *H05K 2201/10136* (2013.01); *H05K 2201/10681* (2013.01)

(58) Field of Classification Search
CPC ...... H05K 2201/05; H05K 2201/10681; G06F 1/1616; G06F 1/1683
USPC .... 361/749, 679.21, 679.22, 679.26, 679.27, 361/679.28; 349/149–152
See application file for complete search history.

(56) References Cited

U.S. PATENT DOCUMENTS

| | | | | |
|---|---|---|---|---|
| 5,737,053 A | * | 4/1998 | Yomogihara | ....... G02F 1/13452 349/149 |
| 8,319,109 B2 | * | 11/2012 | Ishii | .................... G02F 1/13452 174/254 |

(Continued)

FOREIGN PATENT DOCUMENTS

| | | |
|---|---|---|
| KR | 10-2006-0126069 A | 12/2006 |
| WO | 2007/142065 A1 | 12/2007 |

OTHER PUBLICATIONS

International Search Report for PCT/KR2015/011586 dated Feb. 19, 2016 [PCT/ISA/210].

(Continued)

*Primary Examiner* — Binh Tran
(74) *Attorney, Agent, or Firm* — Sughrue Mion, PLLC

(57) ABSTRACT

A display unit and a display device are disclosed. The display unit includes a display panel configured to display a content thereon, a printed circuit board (PCB) configured to generate a drive signal for driving the display panel; and a chip-on-film in which a display driver integrated circuit (IC) is mounted, configured to electrically interconnect the display panel and the PCB. One side of the PCB includes an uneven part including a convex region and a concave region, and the PCB is bonded to the chip-on-film in the concave region. The display device includes the display unit and a stand.

20 Claims, 15 Drawing Sheets

(51) Int. Cl.
*H05K 7/00* (2006.01)
*H05K 1/18* (2006.01)

(56) References Cited

U.S. PATENT DOCUMENTS

| | | | |
|---|---|---|---|
| 2004/0092137 A1* | 5/2004 | Sakaki | H05K 1/147 439/65 |
| 2010/0220072 A1 | 9/2010 | Chien et al. | |
| 2010/0265225 A1 | 10/2010 | Han et al. | |
| 2012/0044160 A1 | 2/2012 | Lan et al. | |
| 2012/0170223 A1 | 7/2012 | Yoon | |
| 2012/0236227 A1 | 9/2012 | Jang et al. | |
| 2013/0201620 A1* | 8/2013 | Schlaupitz | H01R 12/57 361/679.27 |
| 2014/0328031 A1 | 11/2014 | Yang et al. | |
| 2015/0036300 A1 | 2/2015 | Park et al. | |
| 2015/0043136 A1 | 2/2015 | Kim et al. | |

OTHER PUBLICATIONS

Communication dated Sep. 15, 2016, issued by the European Patent Office in counterpart European Application No. 15197119.9.

* cited by examiner

DISPLAY UNIT AND DISPLAY DEVICE INCLUDING THE SAME

CROSS-REFERENCE TO RELATED APPLICATION

This application claims priority from Korean Patent Application No. 2015-0061726, filed on Apr. 30, 2015 in the Korean Intellectual Property Office, the disclosure of which is herein incorporated by reference.

BACKGROUND

1. Field

Apparatuses, devices, and articles of manufacture consistent with the present disclosure relate to a display unit and a display apparatus, and more particularly to a display unit, which includes a display panel, a printed circuit board (PCB), and a chip-on-film electrically interconnecting the display panel and the PCB, and a display apparatus including the display unit.

2. Description of the Related Art

In recent times, higher-resolution and larger-sized display panels configured to display content on a display apparatus have been intensively researched and developed.

With rapidly increasing demand for larger-sized and higher-resolution display panels, a display apparatus including a top chassis and a bottom chassis configured to cover such display panel is gradually reduced in thickness. As the display apparatus is gradually reduced in thickness and a bezel of the top chassis has a smaller thickness, concentration of a user who views images displayed on the display apparatus may be gradually increased. That is, a viewable area may be gradually increased.

Due to the presence of a printed circuit board (PCB) for driving a display panel, a flexible PCB for interconnecting the display panel and the PCB, and a cover for protecting the PCB; a lower end of the bottom chassis may be thicker than an upper end of the bottom chassis.

SUMMARY

It is an aspect to provide a display unit and a display apparatus including the same.

Additional aspects of the invention will be set forth in part in the description which follows and, in part, will be obvious from the description, or may be learned by practice of the invention.

In accordance with an aspect of an exemplary embodiment, there is provided display unit that includes a display panel configured to display a content thereon; a printed circuit board (PCB) configured to generate a drive signal for driving the display panel; and a chip-on-film in which a display driver integrated circuit (IC) is mounted, configured to electrically interconnect the display panel and the PCB, wherein one side of the PCB includes an uneven part including a convex region and a concave region, and the PCB is bonded to the chip-on-film in the concave region.

The uneven part may be arranged to face the display panel.

The display panel, the chip-on-film, and the printed circuit board (PCB) may be connected in order of a gravity direction.

In accordance with another aspect of an exemplary embodiment, there is provided a display device that includes a display unit which includes a display panel configured to display a content thereon, a printed circuit board (PCB) configured to generate a drive signal for driving the display panel, and a chip-on-film in which a display driver integrated circuit (IC) is mounted, configured to electrically interconnect the display panel and the PCB; and a stand configured to support the display unit, wherein one side of the PCB includes an uneven part including a convex region and a concave region, and the PCB is bonded to the chip-on-film in the concave region.

The display panel may be a curved display panel having a curvature, or a flat display panel.

The display unit may be a curved display unit having a curvature, or a flat display unit.

In accordance with another aspect of an exemplary embodiment, there is provided a display unit that includes a display panel; a printed circuit board (PCB) arranged at one side of the display panel; and a chip-on-film configured to electrically interconnect the display panel and the printed circuit board (PCB), wherein one side of the printed circuit board (PCB) arranged to face one side of the display panel includes a first part, and a second part being spaced farther apart from the display panel than the first part, and the PCB is connected to the chip-on-film at the second part.

In accordance with another aspect of an exemplary embodiment, there is provided a display unit that includes a display panel; a printed circuit board (PCB) having an edge facing an edge of the display panel, at least one portion of the edge of the PCB being cutout to form a cutout region; and a chip-on-film comprising an integrated circuit (IC) mounted therein, the chip-on-film electrically connecting the PCB to the display panel, and attached such that the IC is positioned within the cutout portion of the PCB.

BRIEF DESCRIPTION OF THE DRAWINGS

These and/or other aspects will become apparent and more readily appreciated from the following description of exemplary embodiments, taken in conjunction with the accompanying drawings of which.

DETAILED DESCRIPTION

Figure 1:
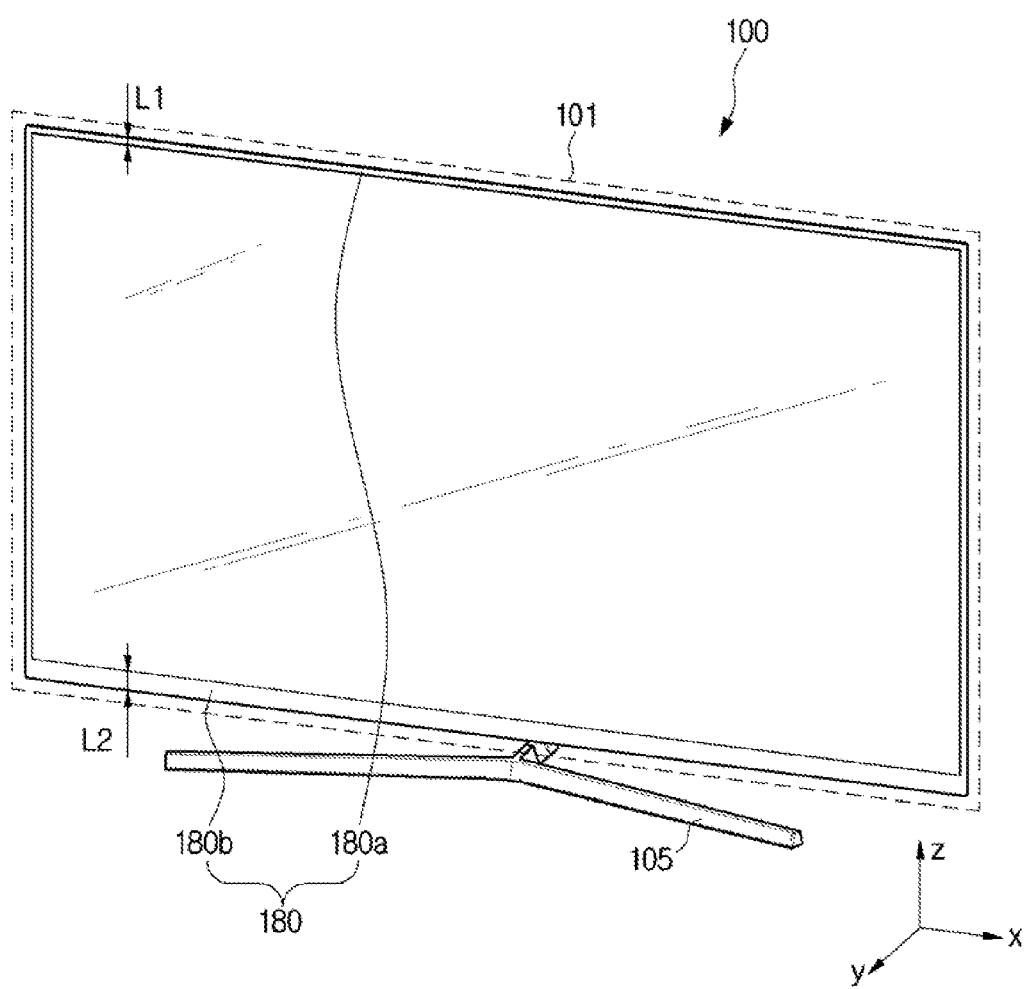
FIG. 1 is a front perspective view illustrating a display apparatus according to an exemplary embodiment.

Reference will now be made in detail to embodiments, examples of which are illustrated in the accompanying drawings, wherein like reference numerals refer to like elements throughout.

In description, the terms "first" and "second" may be used to describe various components, but the components are not limited by the terms. The terms may be used merely to distinguish one component from another component. For example, a "first" component may be called a "second" component and a "second" component may be called a "first" component without departing from the scope of the present disclosure. The term "and/or" may include a combination of a plurality of items or any one of a plurality of items.

The term "application" may indicate software executed by any of a desktop Operating System (OS), a mobile OS, or a display device OS, such that the software can be used by users who use the OSs. For example, the application may include a word-processor, a spreadsheet, contacts application, calendar application, memo application, alarm application, Social Network Service (SNS) application, chat application, map application, music application, or video application. The application according to the exemplary embodiments may indicate software executable in a display device in response to a received user input signal. In addition, the application according to the exemplary embodiments may be downloaded from an external part of the display device, and may be executable in the display device.

The term "content" may be displayed on the application executed in the display device. For example, the content may include a video or audio file reproduced by a video player acting as one of such applications, a music file reproduced by a music player, a photo file displayed in a photo gallery, a webpage file displayed in a web browser, etc. In addition, the content may include a received broadcast signal.

The content may include a video or audio file displayed produced by the application, a text file, an image file, or a web page. In addition, the content may include a video file and/or an audio file contained in the received broadcast signal.

The content may also include a video file, an audio file, a text file, an image file, or a web page executed in response to the received user input (e.g., user touch or the like). The term "video" may be conceptually identical to the term "moving image".

The content may also include an application screen image and a user interface constructing the application screen image. In addition, the content may include one or more contents as necessary.

The term "height" of the constituent elements of the exemplary embodiments may be conceptually identical to the term "width". The height corresponding to the coordinate axis of the constituent element may be conceptually identical to the width.

The terms used in the present application are merely used to describe specific exemplary embodiments and are not intended to limit the present inventive concept. A singular expression may include a plural expression unless context clearly indicates otherwise. In the present application, the terms "including" or "having" are used to indicate that features, numbers, steps, operations, components, parts or combinations thereof described in the present specification are present and presence or addition of one or more other features, numbers, steps, operations, components, parts or combinations is not excluded.

FIG. 1 is a front perspective view illustrating a display apparatus according to an exemplary embodiment.

Referring to FIG. 1, the display apparatus 100 (hereinafter referred to as "display device") may include a display unit 101 and a stand 105 for supporting the display unit 101.

The display unit 101 may include a display panel 170 (see FIG. 3) for displaying content thereon, and a bottom chassis 110 and a top chassis 180 configured to support the display panel 170. In addition, the display unit 101 may include various constituent elements (e.g., 120 to 170 of FIG. 3), and a detailed description thereof will hereinafter be given.

A width (L1) of an upper bezel 180a of the top chassis 180 may be shorter than a width (L2) of the lower bezel 180a of the top chassis 180. For example, the width (L2) of the lower bezel 180a of the top chassis 180 may be about 30.0 mm.

The above-mentioned technical description that the width (L2) of the lower bezel of the top chassis 180 can be changed in response to slimness of the display device 100 may be readily appreciated by those skilled in the art.

The stand 105 may include a wall mount (not shown) for fixing the display unit 101 to a wall surface.

The display device 100 may include an analog television (TV), a digital TV, a 3-dimensional TV (3DTV), a smart TV, a light emitting diode (LED) TV, an organic light emitting diode (OLED) TV, a plasma TV, and/or a monitor, etc. In addition, the display device 100 may include a mobile phone, a smartphone, an MP3 player, a moving image player, a tablet PC, an electronic blackboard, and/or a wearable device, etc., each of which includes a display. That is, while a large-sized, stand-mounted display apparatus is shown, the present inventive concept applies as well to display apparatuses having different sizes.

The display device 100 may be implemented as a flat display device, a curved display device having a fixed curvature screen, a flexible display device having a fixed curvature screen, a bendable display device having a fixed curvature screen, and/or a curvature-variable display device capable of changing a curvature of a current screen using a received user input signal. The scope or spirit of the present inventive concept is not limited thereto, and the technical scope may also be readily appreciated by those skilled in the art.

Figure 2:
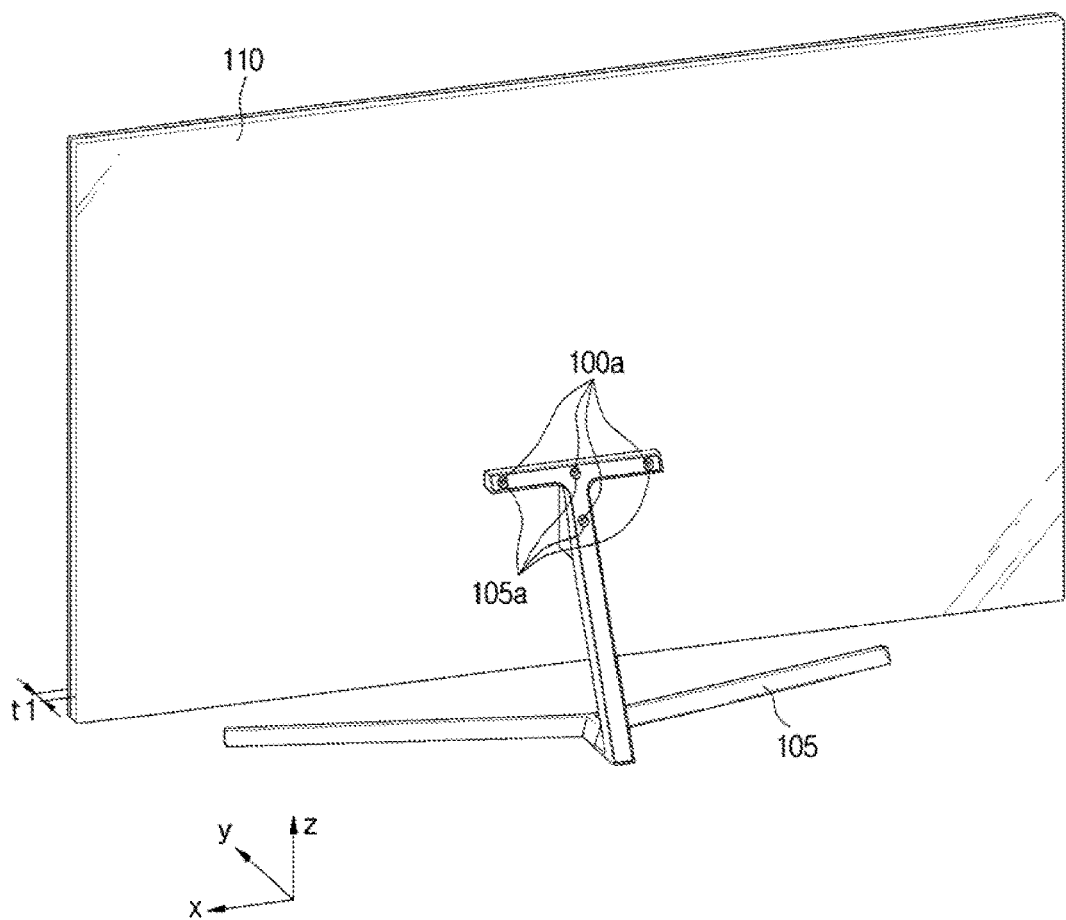
FIG. 2 is a rear perspective view illustrating the display apparatus according to an exemplary embodiment.

FIG. 2 is a rear perspective view illustrating the display apparatus of FIG. 1, according to an exemplary embodiment.

Referring to FIG. 2, the stand 105 may be coupled to the rear surface (e.g., the bottom chassis 110 of the display unit 101) of the display device 100. The bottom chassis 110 and the stand 105 may be coupled by a fastening member (e.g., a screw, a rivet, a nut, an adhesive, etc.). The fastening member 100a may couple the bottom chassis 110 of the display unit 101 to the stand 105 through the fastening hole 105a of the stand 105 and the fastening hole (not shown) of the bottom chassis 110.

A power cable (not shown) may be connected to a power-supply terminal (not shown) of the bottom chassis 110 of the display device 100.

A thickness of the display device 100 may be identical to a thickness (t1) of the display unit 101 excluding the stand 105. For example, the display unit 101 may have a thickness (t1) of about 5.5 mm, or in some exemplary embodiments a thickness of about 5.4 mm or less.

The above-mentioned technical description that the thickness (t1) of the display unit 101 can be changed in response to slimness of the display device 100 may be readily appreciated by those skilled in the art.

The bottom chassis 110 may have a flat rear surface. In some exemplary embodiments, a curvature of the rear surface of the bottom chassis 110 may be identical to the curvature of the display panel 170. Alternatively, in some exemplary embodiments, the curvature of the rear surface of the bottom chassis 110 may be different from the curvature of the display panel 170.

Figure 3:
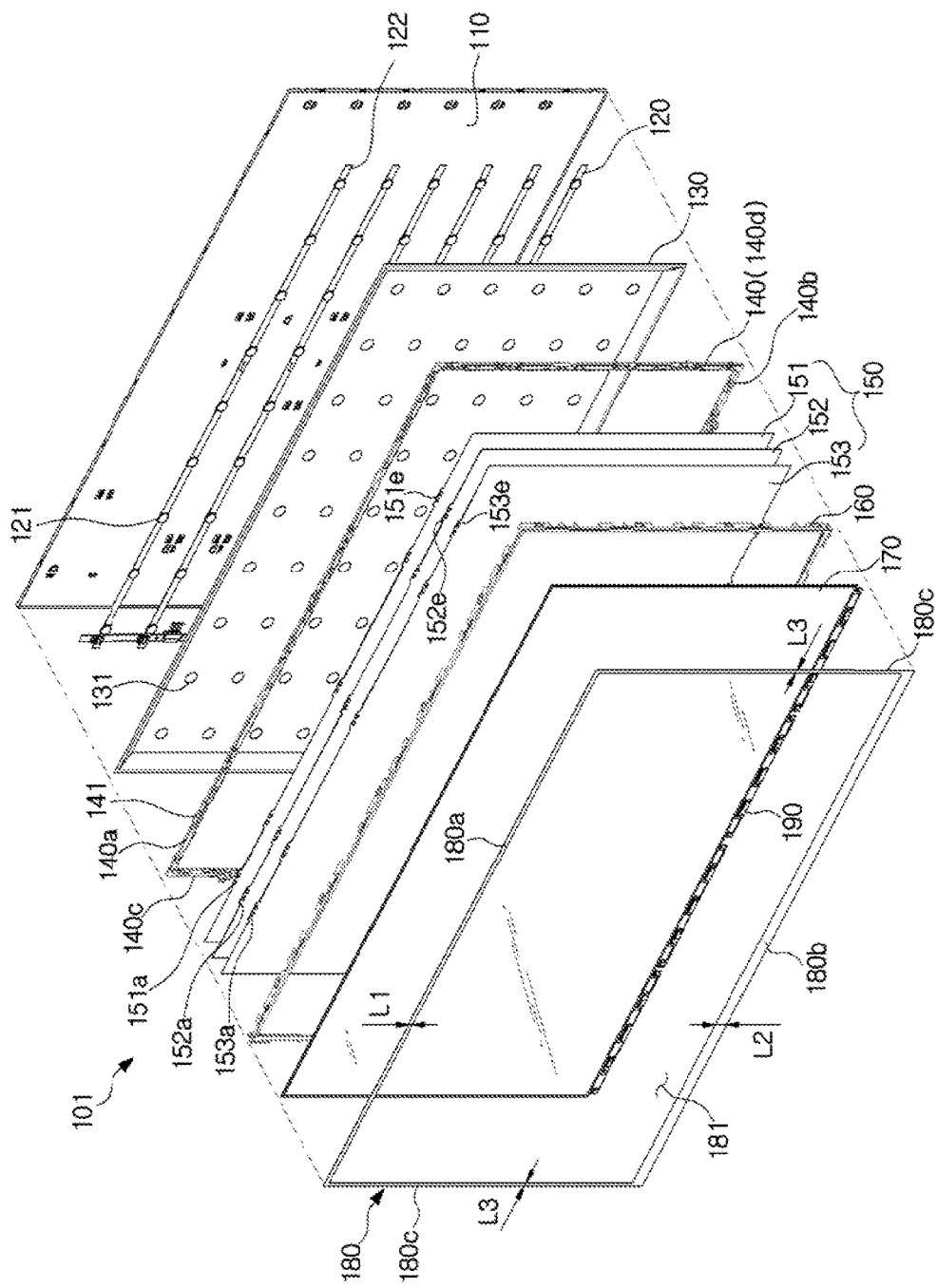
FIG. 3 is an exploded perspective view illustrating a display unit of the display apparatus according to an exemplary embodiment.

FIG. 3 is an exploded perspective view illustrating a display unit of the display device of FIG. 1, according to an exemplary embodiment.

Referring to FIG. 3, the display unit 101 may include a bottom chassis 110, a light source 120, a reflection sheet 130, a middle holder 140, an optical sheet 150, a middle mold 160, a display panel 170, and a top chassis 180.

The bottom chassis 110 may include a plurality of constituent elements 120 to 170 seated therein.

The bottom chassis 110 may include a metal material (e.g., aluminum or the like) having low thermal deformation caused by heating of the high-intensity light source 120 and/or the display panel 170. The metal material may include light metals having specific gravity of about 4 or less, for example, magnesium (Mg), beryllium (Be), titanium (Ti), alkali metals, or alkali earth metals. The metal material may include nonferrous metals other than both iron (Fe) and alloy in which iron is used as the main component.

The bottom chassis 110 may be formed of polycarbonate (PC). In addition or alternatively, the bottom chassis 110 may be formed by adding glass fiber to the PC.

The light source 120 may be seated in the bottom part of the bottom chassis 110, and may emit light upon receiving a power-supply voltage from an external part. The light source 120 may emit the light in the direction of the display panel 170, and may be used as a backlight unit of the display device 100. The light source 120 may include a light emitting diode (LED) 121. In addition or alternatively, the light source 120 may be a cold cathode fluorescent lamp (CCFL) (not shown).

The light source 120 may include a plurality of LED bars 122, each of which comprises a plurality of LEDs 121. The LED bars 122 may be spaced apart from one another in the bottom chassis 110 (e.g., the bottom part), and may be arranged parallel to one another in the bottom chassis 110. One pair of the LED bars 122 may be arranged at both sides (e.g., upper and lower sides or right and left sides) of the bottom chassis 110. Alternatively, the plural LED bars 122 may be arranged at both sides (e.g., one of upper and lower sides, or one of right and left sides) of the bottom chassis 110. Alternatively, the plural LED bars 122 may also be arranged at sides (e.g., up, down, left, and right sides) of the bottom chassis 110. That is, the configuration and positional arrangement of the LED bars 122 and the LEDs 121 are not particularly limited, as long as the LED bars 122 and LEDs 121 are seated in the bottom chassis 110.

The reflection sheet 130 (also called "reflecting sheet") may be arranged over the light source 120, and may increase luminous efficacy by reflecting the leakage light in the direction of the display panel 170. The reflection sheet 130 may be coated with a white or silver high-reflective coating material (e.g., silver, $TiO_2$). The reflection sheet 130 may include a plurality of apertures (or openings) 131 corresponding to protrusion of the LEDs 121 located in the bottom chassis 110. The LEDs 121 protruding from the apertures 131 of the reflection sheet may emit light in the direction of the display panel 170. The reflection sheet 130 may have a sheet shape or a plate shape.

The middle holder 140 may support the optical sheet 150 using a plurality of middle holder protrusions 141. The middle holder 140 may be contained in a plurality of edges (e.g., four corners or three or more corners). The light emitted from the light source 120 may be incident upon the optical sheet 150 without interference of the middle holder 140.

The middle holder 140 may include an upper middle holder 140a and a lower middle holder 140b. The upper middle holder 140a may include at least one middle holder protrusion 141. The lower middle holder 140b may include at least one middle holder protrusion 141. The middle holder protrusion 141 of the upper middle holder 140a and the middle holder protrusion 141 of the lower middle holder 140b may be formed as a pair, for example, two protrusions may be formed. However, it should be noted that in some exemplary embodiments, the middle holder 140 may include only one middle holder protrusion 141. The number of middle holder protrusions 141 may be less than the number of apertures of the optical sheet 150. For example, if the number of apertures of the optical sheet 150 is set to 6, the number of middle holder protrusions may be set to 3 corresponding to ½ the number (6) of apertures.

The middle holder 140 may include at least one middle holder protrusion (not shown) in each of the left middle holder 140c and the right middle holder 140d at four side corners, instead of including the at least one middle holder protrusion 141 contained in each of the upper middle holder 140a and the lower middle holder 140b at four side corners. Alternatively, the middle holder 140 may include at least one middle holder protrusion 141 in each of the upper middle holder 140a, the lower middle holder 140b, the left middle holder 140c and the right middle holder 140d. That is, the location and number of the middle holder protrusions 141 are not particularly limited.

The optical sheet 150 may be located over the middle holder 140, and the light source 120 may be located below the middle holder 140. One side of the reflection sheet 130 may be located below the middle holder 140.

The optical sheet 150 may allow the light emitted from the light source 120 to have uniform brightness. The uniform-brightness light having passed through the optical sheet 150 may be incident upon the display panel 170.

The optical sheet 150 may include a plurality of sheets 151 to 153 configured to overlap with one of the at least one middle holder protrusion 141 and the first middle mold protrusion (not shown). The optical sheet 150 may include a protective sheet, a prism sheet, or a diffuser sheet. The optical sheet 150 may include not only three sheets but also two or four sheets; that is, the number of sheets are not particularly limited. In addition, optical characteristics of the optical sheet 150 may be changed according to the number of optical sheets 150 of the display unit 101.

The first sheet 151 may include a plurality of apertures (e.g., 151a to 151e, note that some apertures are not shown) in a plurality of protrusion regions formed in a side surface of the sheet. The aperture 151a may include one or more apertures. Several protrusion regions and several protrusion apertures of the other sheets (152, 153) may be identical to those of the first sheet 151.

The optical sheet 150 may be supported by the at least one middle holder protrusion 141 inserted through some apertures from among the plurality of apertures (151a, 152a, 153a, some apertures are not shown). In addition, the optical sheet 150 may be supported by any one of the at least one middle holder protrusion 141 of the upper middle holder 140a and the at least one middle holder protrusion 141 of the upper middle holder 140b. Here, the at least one middle holder protrusion 141 of the upper middle holders (140a, 140b) may be inserted through some apertures from among the plurality of apertures (151a, 152a, 153a, the remaining apertures are not shown). That is, the protrusions and apertures function to hold the optical sheet 150 in place and/or to hold the sheets 151 to 153 of the optical sheet 150 in a certain configuration.

The number of apertures (some apertures are not shown) may be identical to the number of the at least one middle holder protrusion 141. For example, if the number of apertures (some apertures are not shown) is set to 10, the number of middle holder protrusions 141 may be set to 5 or may be set to 4 or less. In addition, the number of apertures (some apertures are not shown) may correspond to the number of middle holder protrusions 141 and the number of first middle holder protrusions (not shown). For example, if the number of apertures (some apertures are not shown) is set to 1, the sum of the number of middle holder protrusions 141 and the number of first middle mold protrusions (not shown) may be set to 10 or may be set to 9 or less.

From among apertures (some apertures are not shown) of the sheet 151, the spacing between upper apertures (151a to 151e) may be shorter than the spacing between lower apertures (some apertures are not shown) in consideration of thermal expansion of the sheet.

The optical sheet 150 may be located over the middle holder 140. A diffuser configured to diffuse light emitted from the light source 120 may be located between the middle holder 140 and the optical sheet 150.

The middle mold 160 may be located below the display panel 170, and may be configured to support the display panel 170. In addition, the middle mold 160 may allow the display panel to be spaced apart from the optical sheet 150 by at least a threshold thickness of the second middle mold protrusion (not shown). The threshold thickness may be predetermined.

The middle mold 160 may include a first middle mold protrusion (not shown) for supporting the optical sheet. In addition, the middle mold 160 may support not only the at least one middle holder protrusion 141 of the middle holder 140 but also the optical sheet 150. The first middle mold protrusion (not shown) may be inserted into the optical sheet aperture (not shown) so as to support the optical sheet 150.

The middle mold 160 may include a plurality of first middle mold protrusions (not shown) in each of an upper middle mold (not shown) and a lower middle mold (not shown) at a plurality of corners. One pair of first middle mold protrusions (not shown) may be formed, for example, two first middle mold protrusions may be formed. In addition, the number of first middle mold protrusions (not shown) may be formed of one protrusion. The first middle mold protrusions (not shown) may be less than the number of apertures of the optical sheet. For example, if the number of apertures of the optical sheet 151 is set to 6, the number of first middle holder apertures may be set to 3 corresponding to ½ of the number (6) of apertures.

In order to support the optical sheet 150, the facing at least one middle holder protrusion 141 may be arranged to cross the first middle mold protrusion (not shown). One of the at least one middle holder protrusion 141 and the first middle mold protrusion (not shown) may be arranged. For example, if the at least one middle holder protrusion 141 is inserted into the optical sheet aperture 151, the facing first middle mold protrusion (not shown) may not be arranged. If the first middle mold protrusion (not shown) is inserted into the optical sheet aperture 151, the facing at least one middle holder protrusion 141 may not be arranged.

The middle mold 160 may include a second middle mold protrusion (not shown) formed at one side of the first middle mold protrusion (not shown). The second middle mold protrusion (not shown) may protrude in parallel to the optical sheet 150, for example, the second middle mold protrusion (not shown) may protrude from a black matrix area to an active area of the display panel 170.

The middle mold 160 may include an acrylonitrile-butadiene-styrene (ABS) resin and/or a glass fiber. In addition, the middle mold 160 may include various plastics, resins, and/or metals.

The display panel 170 may include a thin film transistor (TFT) substrate and a liquid crystal display (LCD). The display panel 170 may include a TFT substrate and AMO-LED (active matrix organic light emitting diodes). In addition, the display panel 170 may include a TFT substrate and OLED (organic light emitting diodes). The scope or spirit of the present inventive concept is not limited thereto, and the technical idea of the present inventive concept may be readily appreciated by those skilled in the art.

The display panel 170 may include a polarization plate (not shown) and/or a color filter (not shown).

The display panel 170 may include an active area (not shown) on which content is displayed using the emitted light; and a black matrix area (not shown) configured to enclose corners of the active area (not shown) so as not to display content thereon.

A printed circuit board (PCB) 190 configured to generate a drive signal for driving the display panel 170 may be located at a lower end of the display panel 170. Alternatively or additionally, the PCB 190 configured to generate a drive signal for driving the display panel 170 may be located at an upper end of the display panel 170.

Alternatively or additionally, the PCB 190 configured to generate a drive signal for driving the display panel 170 may be located at any one of left and right sides of the display panel 170, or may be located at both of the left and right sides of the display panel 170.

Figure 4A:
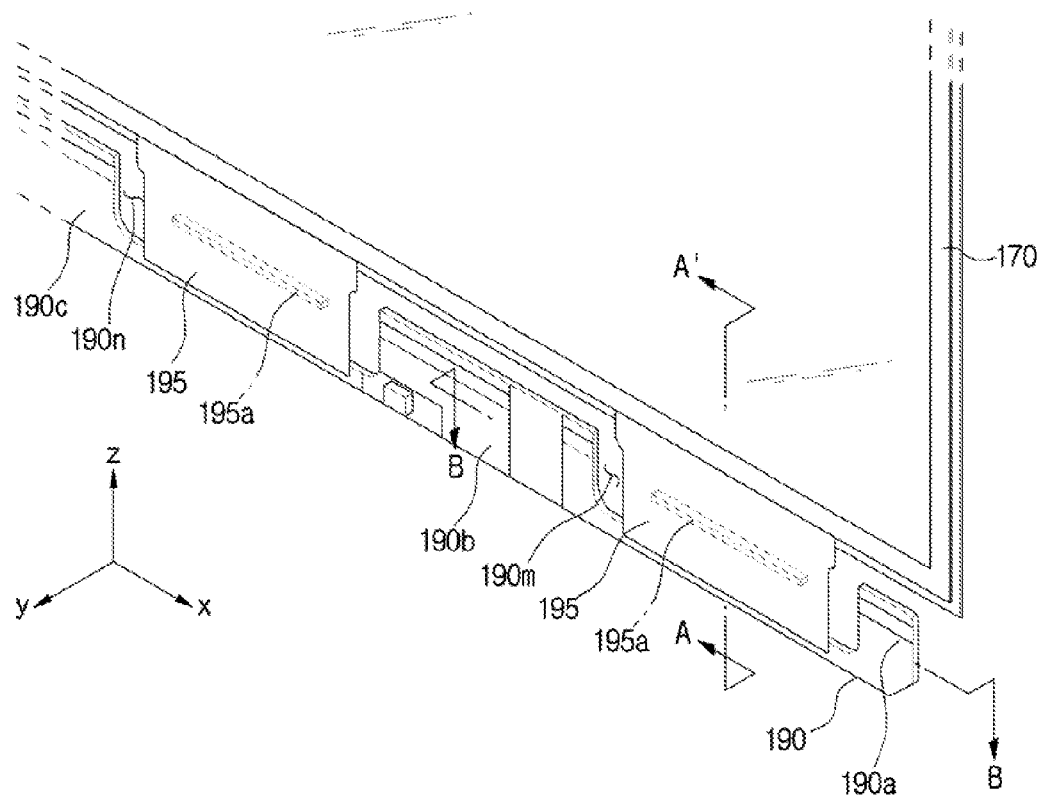
FIG. 4A is an enlarged perspective view illustrating a lower end of the display unit according to an exemplary embodiment.

The display panel 170 may be electrically connected to the PCB 190 through the chip-on-film 195 (see FIG. 4A). The display panel 170, the chip-on-film 195, and the PCB 190 may be interconnected in the direction of gravity (e.g., the (−) z axis direction).

The middle mold 160 may be located below the display panel 170.

The top chassis 180 may be coupled to the bottom chassis 110 including the constituent elements (120 to 170) of the display unit 101. The top chassis 180 may be arranged at the front surface of the display unit 101, and may prevent the constituent elements (120 to 170) from being damaged by external impact and/or may prevent the light emitted from the light source 120 from leaking outside (for example, the top chassis 180 may prevent loss of light).

The top chassis 180 may be formed along the circumference of the display panel 170. The top chassis 180 may have a cross-sectional shape (e.g., "]") formed to cover the edge parts of top and side surfaces of the display panel 170. The top chassis 180 may include an aperture (or opening) 181. Each of the front surfaces of four corners other than the aperture 181 of the top chassis 180 may be referred to as a bezel (see also FIG. 1).

Content displayed on the display panel 170 may be provided through the aperture 181. The entire active area (not shown) of the display panel 170 and some parts (e.g., about 5 mm or less from the corner arranged in the direction of a bezel's aperture) of the black matrix area (not shown) may be displayed through the aperture 181. In addition, some parts (e.g., about 15 mm or less from the corner arranged in the direction of a bezel aperture) of the black matrix area (not shown) may be displayed through the aperture 181.

A width (L1) of the upper bezel 180a of the top chassis 180 may be less than a width (L2) of the lower bezel 180b of the top chassis 180. The width (L2) of the lower bezel 180b of the top chassis 180 may be larger than a width (L3) of the side bezel 180c of the top chassis 180. The width (L1) of the upper bezel 180a of the top chassis 180 may be identical to the width (L3) of the side bezel 180c of the top chassis 180. Alternatively, the width (L1) of the upper bezel 180a of the top chassis 180 may be larger than the width (L3) of the side bezel 180c of the top chassis 180.

The PCB 190 (see FIG. 4A) may be embedded in the area of the lower bezel 180b of the top chassis 180. The width (L2) of the lower bezel 180b of the top chassis 180 including the PCB 190 may be larger than the width (L1) of the upper bezel 180a or the width (L3) of the side bezel 180c.

As the width of the bezel of the top chassis 180 is gradually reduced, the display device 100 may be gradually reduced in weight and/or in size. As the width of the bezel is gradually reduced, the degree of concentration of content displayed on the display device 100 may be gradually increased. That is, the viewable area of the display device 100 may be gradually increased. In addition, as the width of the bezel of the top chassis 180 is gradually reduced, the display device 100 may provide a user with a larger-sized screen, the size of which is increased by the width of a shortened bezel compared with the size of the display unit 101 identical in size to the display device 100.

FIG. 4A is an enlarged perspective view illustrating a lower end of the display unit according to an exemplary embodiment.

Figure 4B:
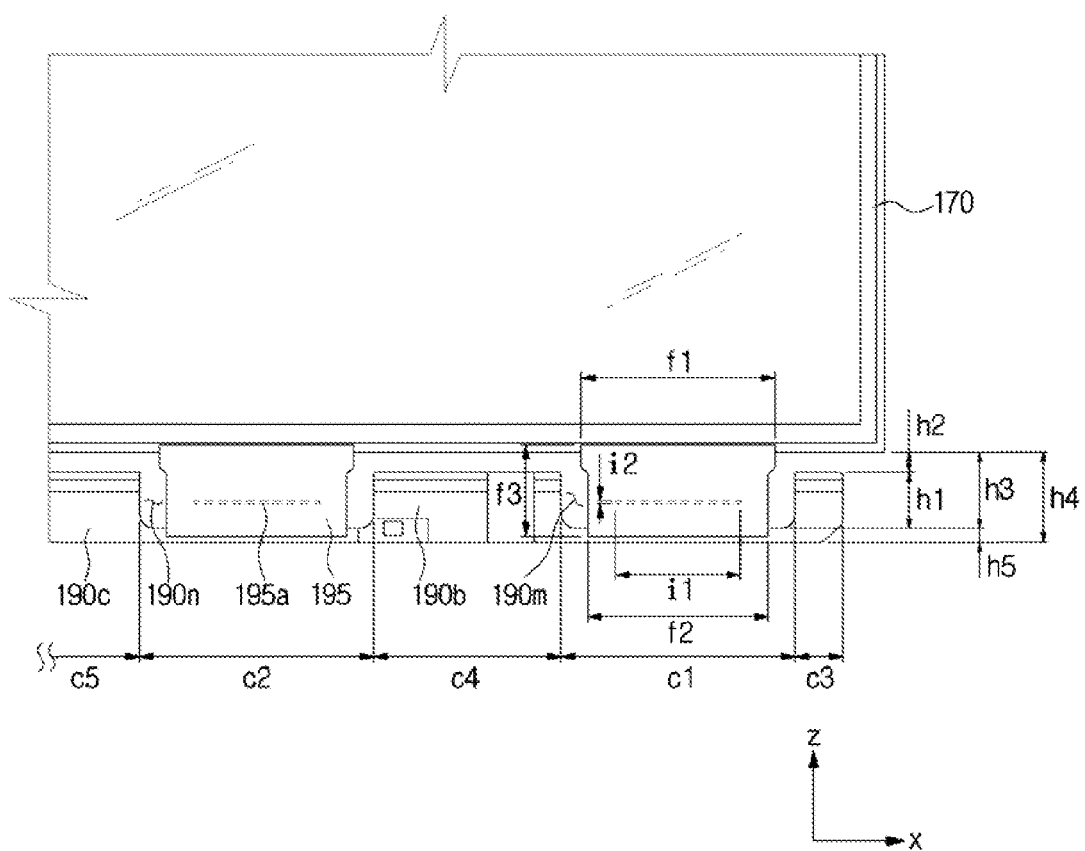
FIG. 4B is an enlarged front view illustrating a lower end of the display unit according to an exemplary embodiment.

FIG. 4B is an enlarged front view illustrating the lower end of the display unit according to an exemplary embodiment.

Referring to FIGS. 4A and 4B, the display panel 170 and the PCB 190 may be interconnected through a flexible chip-on-film 195.

The PCB 190 may include a semiconductor element (e.g., a processor, a condenser, a resistor, or the like) mounted to a printed circuit so as to drive the display panel 170. The PCB 190 may include a timing controller (not shown) and/or a power-supply unit (not shown) for providing a power-supply voltage to the constituent elements (120 to 190) of the display device 100. In addition, the PCB 190 may include a communication unit (not shown) for communicating with an external device (e.g., a mobile device or the like).

A timing controller (not shown) mounted to the PCB 190 may transmit a source drive signal and/or a gate drive signal to the display panel 170 at a time point in such a manner that an image signal received from the external part may be displayed on the display panel 170. The time point may be predetermined. The timing controller (not shown) may receive or transmit an image signal (IMG) from or to the external device using any one of various schemes, for example, Low-Voltage Differential Signaling (LVDS), Digital Video Interface (DVI), High Definition Multimedia Interface (HDMI), a DisplayPort, or the like.

The PCB 190 may include epoxy resin, polyimide resin, Flame Retardant 4 (FR-4) acting as a glass/epoxy composite, FR-5, ceramic, silicon, or glass. The above-mentioned constituent materials of the PCB 190 are merely exemplary, and the scope or spirit of the present disclosure is not limited thereto.

The PCB 190 may include a single-layered structure or a multi-layered structure including line patterns. The PCB 190 may include a single rigid flat plate, may include a plurality of rigid flat plates formed by bonding of the single rigid flat plate, and may be formed by bonding the flexible PCB to the rigid flat plate. The PCB 190 or each of the rigid flat plates bonded to each other may include a line pattern.

One end of the chip-on-film 195 may be bonded to the PCB 190, and the other end of the chip-on-film 195 may be bonded to the display panel 170. One end of the chip-on-film 195 may be electrically connected to the PCB 190, and the other end of the chip-on-film 195 may be electrically connected to the display panel 170. The source drive signal and/or the gate drive signal may be applied to the display panel 170.

The chip-on-film 195 may transmit a drive signal to the display panel 170 through a display driver IC 195a mounted as a single package substrate, such that the display panel 170 can be driven by the drive signal. The display driver IC 195a may be referred to as a display driver integrated circuit (IC) or a display driver chip.

The chip-on-film 195 may include a source drive signal transmission pattern.

The chip-on-film 195 may transmit the source drive signal received from the PCB 190 to the source driver IC through the source drive signal transmission pattern.

In addition, the chip-on-film 195 may transmit a gate drive signal received from the PCB 190 to the gate driver IC through a gate drive signal transmission pattern.

The display driver IC 195a mounted to the chip-on-film 195 may include a source IC for transmitting data in a vertical direction and a gate driver IC for transmitting data in a horizontal direction. One or more source driver ICs may be installed. In addition, one or more gate driver ICs may be installed. That is, the display driver IC 195a may comprise one or more source driver ICs and/or one or more gate driver ICs.

The display driver IC 195a mounted to the chip-on-film 195 may process (e.g., RGB analog signal conversion) the source drive signal received from the PCB 190 through the source drive signal transmission pattern, and may transmit the processed result to the display panel 170.

The display driver IC 195a may process (e.g., RGB analog signal conversion) the gate drive signal received from the PCB 190 through the gate drive signal transmission pattern, and may transmit the processed result to the display panel 170. The display driver IC 195a may control a liquid crystal of the display panel 170 for displaying content thereon.

The chip-on-film 195 in which a flexible base film is coated with a conductive material including a copper foil may be used as a connector for electrically interconnecting the PCB 190 and the display panel 170. The base film of the chip-on-film 195 may include a polyamide film, a polyester film, or a glass cloth epoxy, or the like.

The chip-on-film 195 may be flexible or twisted. The chip-on-film 195 may be curved in the direction (e.g., the (−) y axis direction) of a rear surface of the display panel 170. The chip-on-film 195 may be elongated parallel to the display panel 170 (for example, the chip-on-film 195 may be elongated in a horizontal direction (e.g., the (−) z axis direction)), such that the chip-on-film 195 may be bonded to the PCB 190.

If the chip-on-film 195 is elongated parallel to the display panel 170 (e.g., the chip-on-film 195 is elongated in the (−) z axis direction) and is bonded to the PCB 190, a thickness (t1) of the display device 100 may be reduced.

If the chip-on-film 195 is elongated parallel to the display panel 170 (e.g., the chip-on-film 195 is elongated in the (−) z axis direction) and is bonded to the PCB 190, not only the PCB 190 that is bent and bonded to the rear surface of the bottom chassis 110, but also a PCB cover (not shown) is not present, such that a thickness (t1) of the display device 100 may be reduced.

A horizontal length (e.g., x-axis direction) of the PCB 190 may be longer than a vertical length (e.g., z-axis direction) of the PCB 190.

The PCB 190 located in response to the area of the lower bezel 180b of the top chassis 180 may be formed in a rectangular shape including a concavo-convex (uneven) part (i.e., "⊥⊥"-shaped part). The PCB 190 may include the concavo-convex (i.e., the "⊥⊥"-shaped part), and may be formed in a rectangular shape in which each corner is chamfered.

One side (for example, top, bottom, left or right side) of the PCB 190 may have a concavo-convex shape (for example, in which a convex region and a concave region are repeated. The concavo-concave shape may be formed in a polygonal shape, and all kinds of shapes capable of being bonded to the chip-on-film in the concave region may be used as such concavo-concave shape of this exemplary embodiment.

The concavo-convex part (i.e., "⊥⊥"-shaped part) of the PCB 190 may be arranged to face the display panel 170 (for example, in the z-axis direction on the basis of the PCB 190). The concavo-convex part (i.e., "⊥⊥"-shaped part) of the PCB 190 may be arranged to face the opposite side (e.g., the (−) z-axis direction on the basis of the PCB 190) of the display panel 170. In addition, the concavo-convex part (i.e., "⊥⊥"-shaped part) of the PCB 190 may be arranged to alternately face the display panel 170 and the opposite side of the display panel 170.

The width (c1) of the concave region 190m of the PCB 190 may be larger than a width (f1) of the junction between the chip-on-film 195 and the display panel 170. For example, the width (c1) of the concave region 190m may be set to about 50 mm, and the width (f1) of the junction between the chip-on-film 195 and the display panel 170 may be set to about 41.5 mm.

The width (c1) of the concave region of the PCB 190 may be larger than the width (f2) of the junction between the chip-on-film 195 and the PCB 190. For example, the width (f2) of the junction between the chip-on-film 195 and the PCB 190 may be set to about 30.5 mm.

The width (f1) of the junction between the chip-on-film 195 and the display panel 170 may be larger than the width (f2) of the junction between the chip-on-film 195 and the PCB 190. That is, a width (f1) of the chip-on-film 195 facing the display panel 170 may be greater than a width (f2) of the chip-on-film 195 facing away from the display panel 170, as shown in FIG. 4B. Alternatively, the width (f1) of the junction between the chip-on-film 195 and the display panel 170 may be shorter than the width (f2) of the junction between the chip-on-film 195 and the PCB 190. In addition, the width (f1) of the junction between the chip-on-film 195 and the display panel 170 may be identical to the width (f2) of the junction between the chip-on-film 195 and the PCB 190.

The width (c1) of a first concave region 190m of the PCB 190 may be identical to the width (c2) of a second concave region 190n. However, alternatively, the width (c1) of the first concave region 190m of the PCB 190 may be shorter than the width (c2) of the second concave region 190n. Alternatively, the width (c1) of the first concave region 190m of the PCB 190 may be different from the width (not shown) of a third concave region (not shown).

The display driver IC 195a mounted to the chip-on-film 195 may be located in a concave region (e.g., 190m, 190n, etc.) of the PCB 190. The concave region (e.g., 190m, 190n, etc.) of the PCB 190 may be formed in a polygonal shape, one side of which is opened. The remaining three sides other than one opened side of the concave region (e.g., 190m, 190n, etc.) of the PCB 190 may be sharp-edged (e.g., chamfered or rounded).

The width (i1) of the display driver IC 195a may be shorter than the width (f1) of the junction between the chip-on-film 195 and the display panel 170. For example, the width (i1) of the display driver IC 195a may be set to about 26.8 mm. The width (i1) of the display driver IC 195a may be shorter than the width (c1) of the concave region.

The height (i2) of the display driver IC 195a may be shorter than the height (f3) of the chip-on-film 195. For example, the height (i2) of the display driver IC 195a may be set to about 0.76 mm, and the height (f3) of the chip-on-film 195 may be set to about 19.5 mm.

The width (c3 or c4) of the convex region (190a or 190b) of the PCB 190 may be shorter than the width (c1) of the concave region 190m of the PCB 190. For example, the width (c3) of the convex region 190a may be set to about 10.2 mm, and the width (c4) of the convex region 190b may be set to about 40.0 mm.

The width (c3) of a first convex region 190a of the PCB 190 may be shorter than the width (c4) of a second convex region 190b. However, alternatively, the width (c3) of the first convex region 190a of the PCB 190 may be identical to the width (c4) of the second convex region 190b. The width (c4) of the second convex region 190b of the PCB 190 may be identical to the width (c5) of the third convex region 190c. In addition, the width (c3) of the first convex region 190a of the PCB 190 may be identical to a width of a last convex region (not shown) in the −x direction. That is, FIG. 4B shows a rightmost side of the PCB 190 by way of example, and the first convex regions on either end of the PCB 190 may be identical in width, with only the rightmost first convex region 190a being shown in FIG. 4B.

The height (h1) of the PCB 190 may be shorter than the height (f3) of the chip-on-film 195. For example, the height (h1) of the PCB 190 may be set to about 15.0 mm. As the height (h1) of the PCB 190 is gradually reduced, the width (L2) of the lower bezel 180b of the top chassis 180 of the display unit may be reduced.

The spacing distance (h2) between the display panel 170 and one end of the PCB 190 may be shorter than the height (h1) of the PCB 190. For example, the spacing distance (h2) between the display panel 170 and one end of the PCB 190 may be set to about 4.3 mm. As the spacing distance (h2) between the display panel 170 and an upper end of the PCB 190 is gradually reduced, the width (L2) of the lower bezel 180b of the top chassis 180 of the display unit may be reduced.

The spacing distance (h3) between the display panel 170 and the concave region (190m or 190n) of the PCB 190 may be shorter than the height (f3) of the chip-on-film 195. For example, the spacing distance (h3) between the display panel 170 and the concave region (190*m* or 190*n*) of the PCB 190 may be set to about 16.3 mm. As the spacing distance (h3) between the display panel 170 and the concave region (190*m* or 190*n*) of the PCB 190 is gradually reduced, the width (L2) of the lower bezel 180*b* of the top chassis 180 of the display unit may be reduced.

The spacing distance (h4) between the display panel 170 and each corner of the PCB 190 may be shorter than the height (f3) of the chip-on-film 195. For example, the spacing distance (h4) between the display panel 170 and each corner of the PCB 190 may be set to about 19.3 mm. Alternatively, the spacing distance (h4) between the display panel 170 and each corner of the PCB 190 may be identical to the height (f3) of the chip-on-film 195.

As the spacing distance (h4) between the display panel 170 and the lower end of the PCB 190 is gradually reduced, the width (L2) of the lower bezel 180*b* of the top chassis 180 of the display unit may be reduced.

A difference between the spacing distance (h4) among the corners of the PCB 190 and the spacing distance (h3) between the display panel 170 and the concave region (190*m* or 190*n*) of the PCB 190 may be identical to the height of the junction between the chip-on-film 195 and the PCB 190.

As the height (h5) of the junction region between chip-on-film 195 and the PCB 190 is gradually reduced, the width (L2) of the lower bezel 180*b* of the top chassis 180 of the display unit may be reduced.

As the height (f3) of the chip-on-film 195 is gradually reduced, the width (L2) of the lower bezel 180*b* of the top chassis 180 of the display unit may be reduced.

The height (f3) of the chip-on-film 195 may be reduced in response to the spacing distance (h4) between the display panel 170 and each corner of the PCB 190. The height (f3) of the chip-on-film 195 may be reduced to approximate the spacing distance (h4) between the display panel 170 and each corner of the PCB 190.

In addition, the height (f3) of the chip-on-film 195 may be reduced in a manner that the spacing distance (h4) between the display panel 170 and each corner of the PCB 190 can approximate the value of 0 mm (for example, the display panel 170 may contact the PCB 190).

The values assigned to the various dimensions of the PCB 190 and/or the chip-on-film 195 described above are only exemplary for convenience of description; the scope or spirit of the present disclosure is not limited thereto, and correction, modification, and/or deletion of values assigned to the PCB 190 and/or the chip-on-film 195 in response to slimness of the display device 100 may be readily appreciated by those skilled in the art. It is noted that FIGS. 4A and 4B are not to scale, certain dimensions having been exaggerated for ease and clarity of description.

Figure 5A:
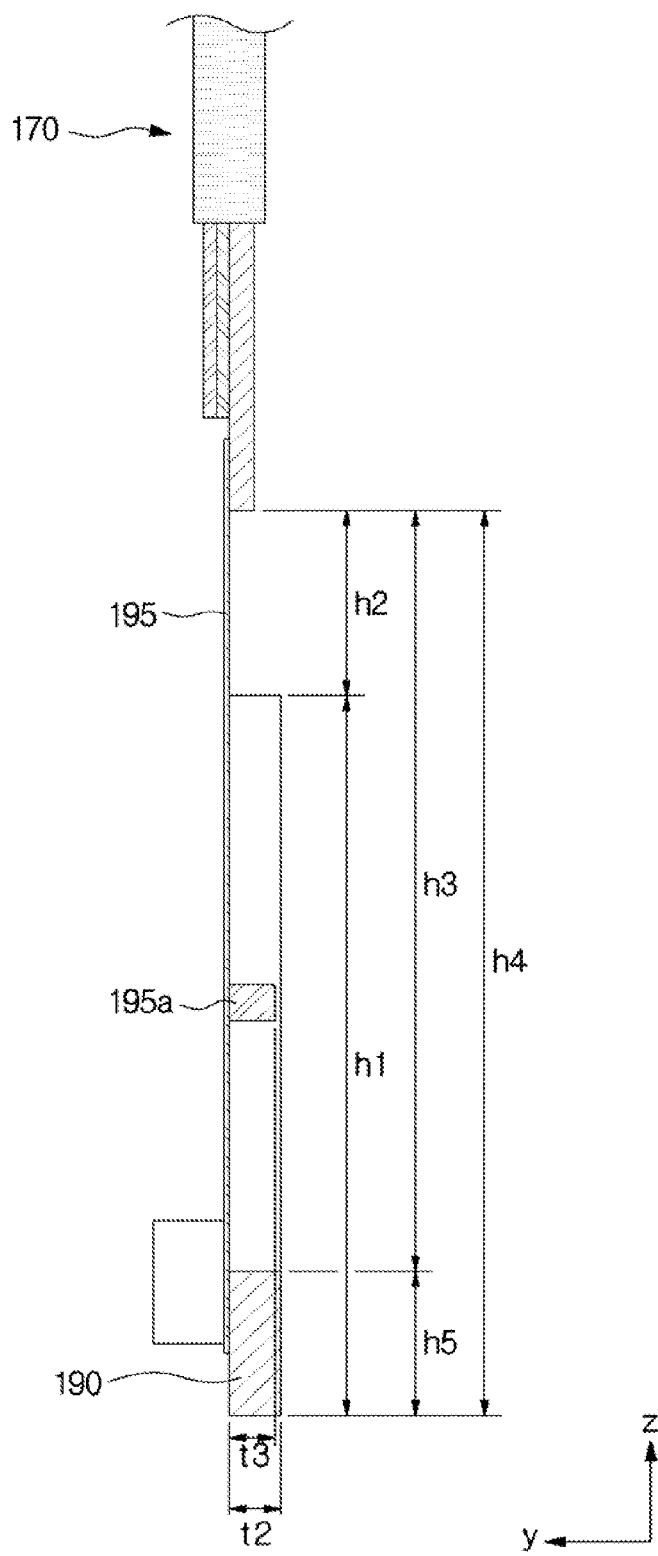
FIG. 5A is a cross-sectional view illustrating a lower end of the display unit taken along the line A-A' of FIG. 4A.

FIG. 5A is a cross-sectional view illustrating a lower end of the display unit taken along line A-A' of FIG. 4A.

Figure 5B:
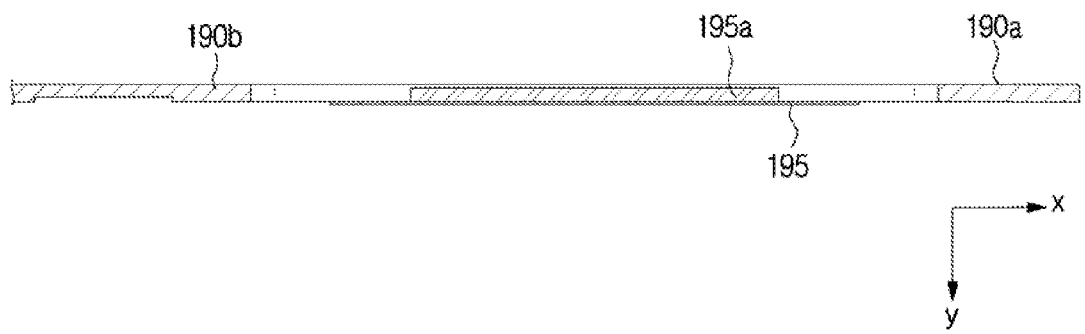
FIG. 5B is a cross-sectional view illustrating a lower end of the display unit taken along the line B-B' of FIG. 4A.

FIG. 5B is a cross-sectional view illustrating a lower end of the display unit taken along line B-B' of FIG. 4A.

Referring to FIGS. 5A and 5B, the display driver IC 195*a* mounted to the chip-on-film 195 may be located in the concave region (e.g., 190*m*) of the PCB 190. The display driver IC 195*a* of the chip-on-film 195 is mounted to the chip-on-film 195 in the concave region (e.g., 190*m*) of the PCB 190, such that the thickness (t1) of the display unit 101 may be reduced.

The thickness (t2) of the PCB 190 may be larger than the thickness (t3) of the display driver IC 195*a* mounted to the chip-on-film 195. For example, the thickness (t2) of the PCB 190 may be set to about 1.0 mm, and the thickness (t3) of the display driver IC 195*a* may be set to about 0.95 mm. However, alternatively, the thickness (t2) of the PCB 190 may be identical to the thickness (t3) of the display driver IC 195*a* mounted to the chip-on-film 195.

The chip-on-film 195 may be curved by a weight of the display driver IC 195*a* mounted to the chip-on-film 195. The PCB 190 bonded to the chip-on-film 195 may be supported by the middle holder 140. The display driver IC 195*a* mounted to the chip-on-film 195 curved by the weight of the display driver IC 195*a* may protrude to the outside of a virtual line extended from the thickness (t2) of the PCB 190.

Figure 6A:
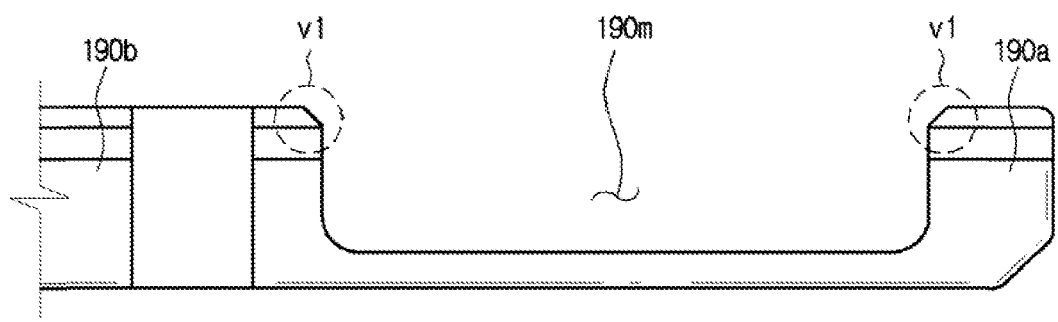
FIGS. 6A to 6C are front views illustrating exemplary concave regions of a printed circuit board (PCB) according to another exemplary embodiment.
Figure 6B:
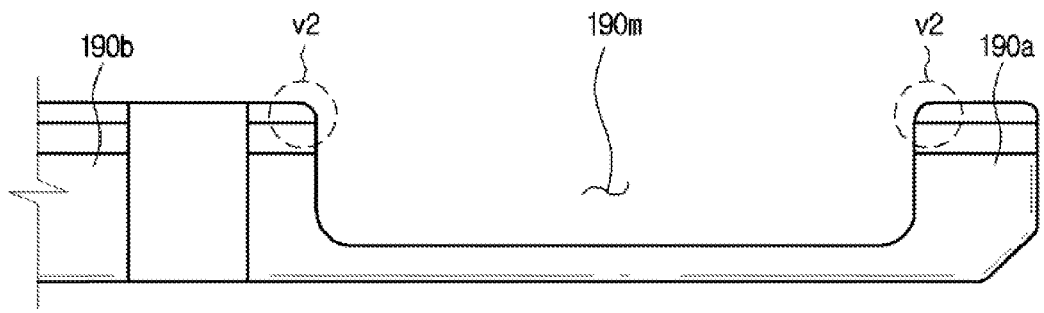
Figure 6C:
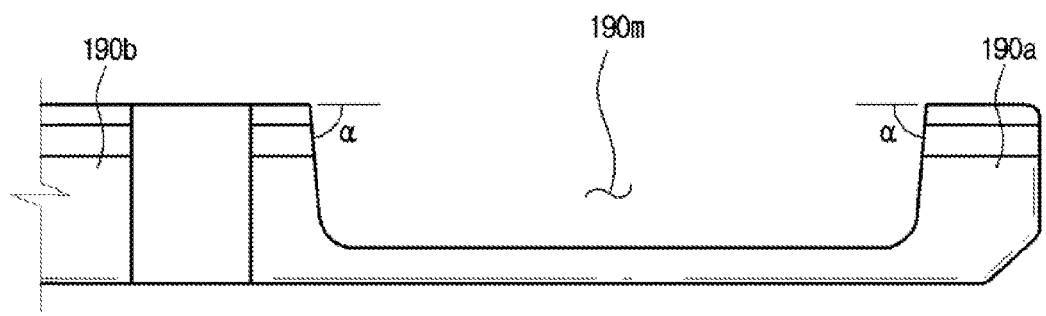

FIGS. 6A to 6C are front views illustrating exemplary concave regions of a printed circuit board (PCB) according to another exemplary embodiment.

Referring to FIG. 6A, a vertex region (v1) of the concave region 190*m* of the PCB 190 may be chamfered as compared to FIG. 4B in which the corner is formed at a right angle. For example, the chamfer of the vertex region (v1) of the concave region 190*m* of the PCB 190 may be denoted by "c=1" (e.g., horizontal length=1 mm, vertical length=1 mm). Alternatively, the horizontal length and the vertical length of the chamfer of the vertex region (v1) of the concave region 190*m* of the PCB 190 may be different from each other.

The above-mentioned description in which the chamfering value of the vertex region (v1) of the concave region 190*m* of the PCB 190 may be changed in response to slimness of the display device 100 may be readily appreciated by those skilled in the art. That is, the values of the chamfer are merely illustrative, and other values may be used to provide the specific chamfer.

Referring to FIG. 6B, the vertex region (v2) of the concave region 190*m* of the PCB 190 may be filleted or rounded as compared to FIG. 4B. For example, the roundness of the vertex region (v2) of the concave region 190*m* of the PCB 190 may be denoted by "R1" (e.g., a radius of 1 mm). The above-mentioned description in which the roundness of the vertex region (v2) of the concave region 190*m* of the PCB 190 may be changed to another value (e.g., "R1.5", "R2") in response to slimness of the display device 100 may be readily appreciated by those skilled in the art.

Referring to FIG. 6C, the corner angle ($\alpha$) of the concave region 190*m* of the PCB 190 may be an acute angle or an obtuse angle as compared to FIG. 4B. For example, the corner angle of the concave region 190*m* of the PCB 190 may be set to 85°. In addition, the corner angle of the concave region 190*m* of the PCB 190 may range from about 60° to about 110°. The above-mentioned description in which the corner angle of the concave region 190*m* of the PCB 190 may be changed in value in response to slimness of the display device 100 may be readily appreciated by those skilled in the art. That is, the values of the corner angle are merely illustrative, and other values may be used to provide the specific corner angle.

Figure 7A:
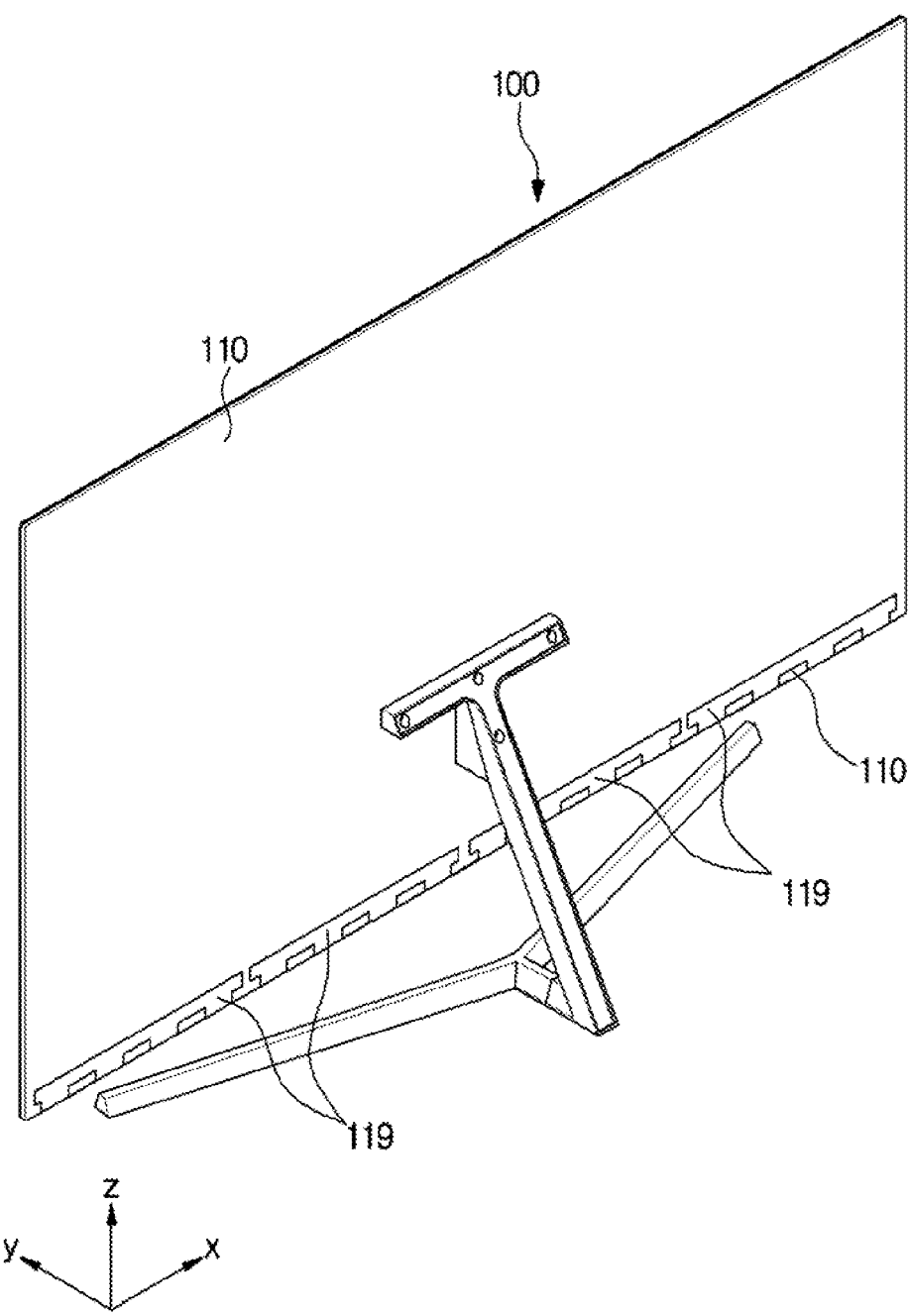
FIG. 7A is a perspective view illustrating a display unit of a display apparatus according to another exemplary embodiment.

FIG. 7A is a perspective view illustrating a display unit of a display device according to another exemplary embodiment.

Figure 7B:
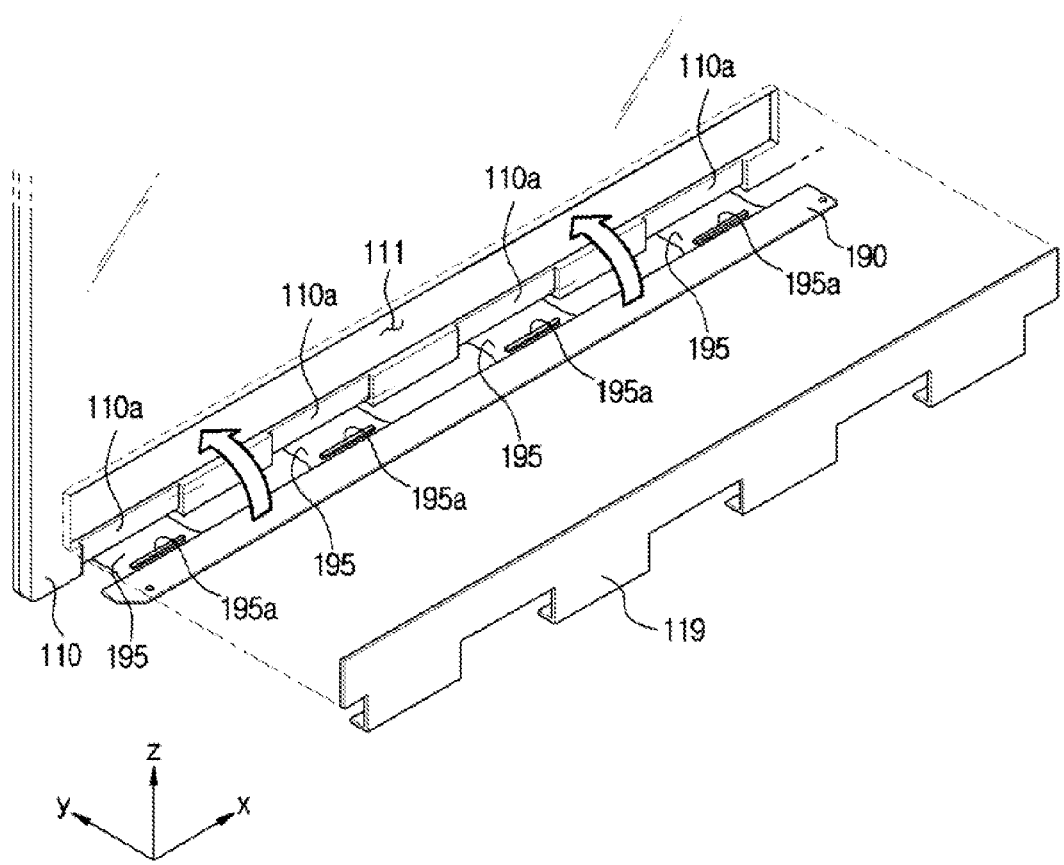
FIG. 7B is a perspective view illustrating a display unit of a display apparatus according to another exemplary embodiment.

FIG. 7B is a perspective view illustrating a display unit of a display device according to another exemplary embodiment.

Figure 7C:
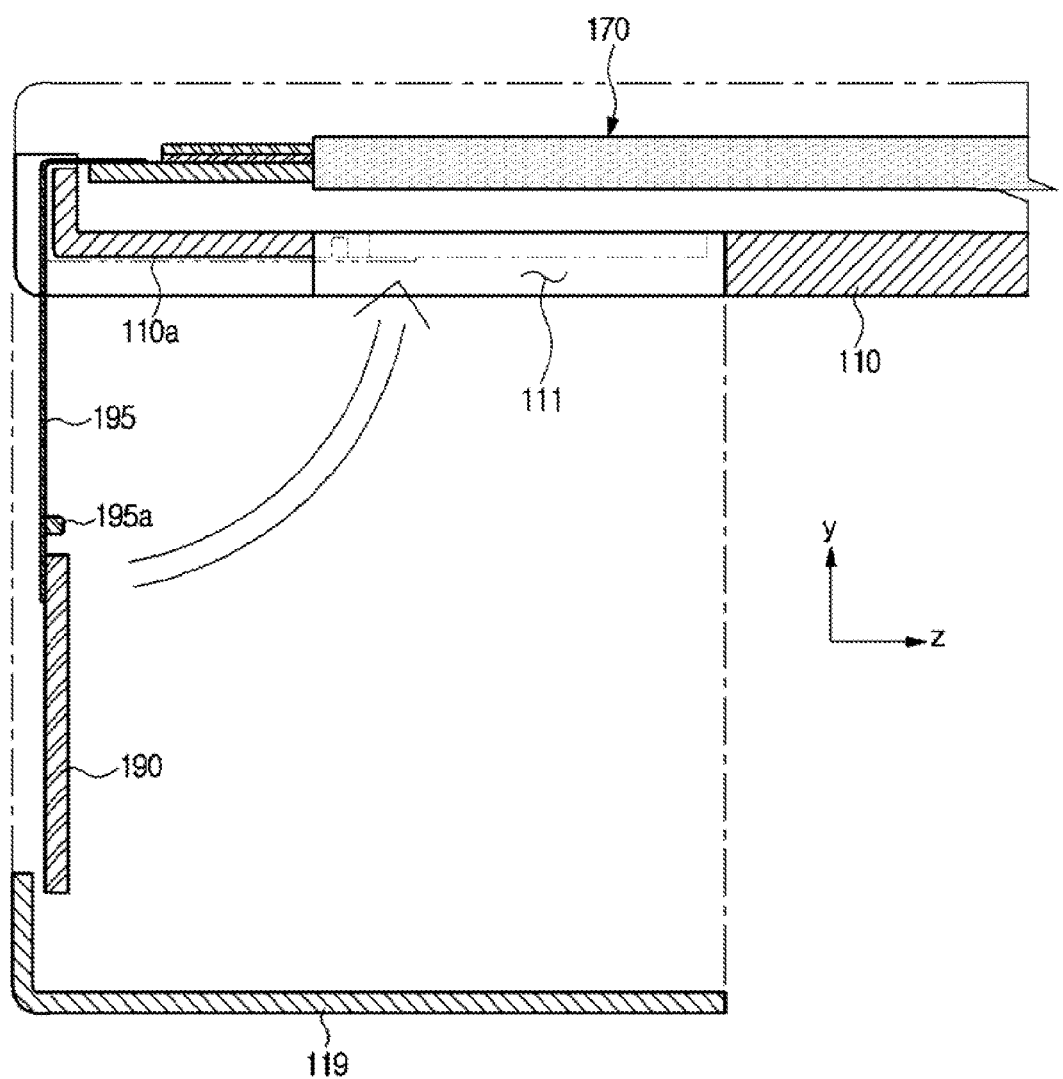
FIG. 7C is a cross-sectional view illustrating a lower end of a display unit of the display apparatus according to another exemplary embodiment.

FIG. 7C is a cross-sectional view illustrating a lower end of a display unit of the display device according to another exemplary embodiment.

Referring to FIGS. 7A to 7C, the stand 105 may be coupled to the rear surface (e.g., the bottom chassis 110) of the display device 100. One or more apertures 111 may be formed in the lower end of the bottom chassis 110 (see FIGS. 7B and 7C) and covered by one or more corresponding covers 119.

As shown in FIG. 7B, the bottom chassis 110 may include a concave region 110a configured to electrically interconnect the PCB 190 and the display panel 170 at the lower end of the bottom chassis 110. The cover 119 may be coupled to the lower end of the rear surface of the bottom chassis 110. The cover 119 may be semipermanently coupled to the bottom chassis 110. The cover 119 may be detachably coupled to the bottom chassis 110.

The aperture 111 of the bottom chassis 110 may include the PCB 190 electrically coupled to the chip-on-film 195. The aperture 111 of the bottom chassis 110 may include the display driver IC 195a mounted to the chip-on-film 195 and the PCB 190. Alternatively, the aperture 111 of the bottom chassis 110 may include some parts of the chip-on-film 195 electrically coupled to the PCB 190. The aperture 111 of the bottom chassis 110 may be larger in size than the region of the PCB 190. A total area of the plural apertures 111 may be larger in size than a total area of the PCB 190.

As shown in FIG. 7C, the chip-on-film 195 may pass over the concave region 110a located at the lower end of the bottom chassis 110. The chip-on-film 195 electrically coupled to the display panel 170 located at the front surface of the bottom chassis 100 may be folded by 180° around a bottom edge, such that the chip-on-film 195 may pass over the concave region 110a located at the lower end of the bottom chassis 110 (see, e.g., arrow in FIG. 7C). The chip-on-film 195 may contact the concave region 110a, or may not contact the concave region 110a.

If the bottom chassis 110 is coupled to the cover 119, the chip-on-film 195 may contact the concave region 110a. If the bottom chassis 110 is coupled to the cover 119, the PCB 190 coupled to the chip-on-film 195 may contact the cover 119.

The concave region 110a located at the lower end of the bottom chassis 110 may be thinner than the bottom chassis 110. For example, the thickness of the concave region 110a may be about 85% of the thickness of the bottom chassis 110 or less. Alternatively, the thickness of the concave region 110a may be about 50% of the thickness of the bottom chassis 110 or less. The above-mentioned description in which the thickness of the concave region 110 may be changed according to the structure and size of the display unit 101 may be readily appreciated by those skilled in the art. That is, the values of the thickness are merely illustrative, and may be changed.

As shown in FIG. 7C, the thickness of the display unit 101 may be reduced by folding the chip-on-film 195 such that the PCB 190 is received in the aperture 111 of the bottom chassis 110. The thickness of the display unit 101 may be reduced by including the chip-on-film 195 and the PCB 190 into the aperture 111 of the bottom chassis 110. In addition, the thickness of the display unit 101 may be reduced by including both the display driver IC 195a mounted to the chip-on-film 195 and the PCB 190 in the aperture 111 of the bottom chassis 110.

Figure 8A:
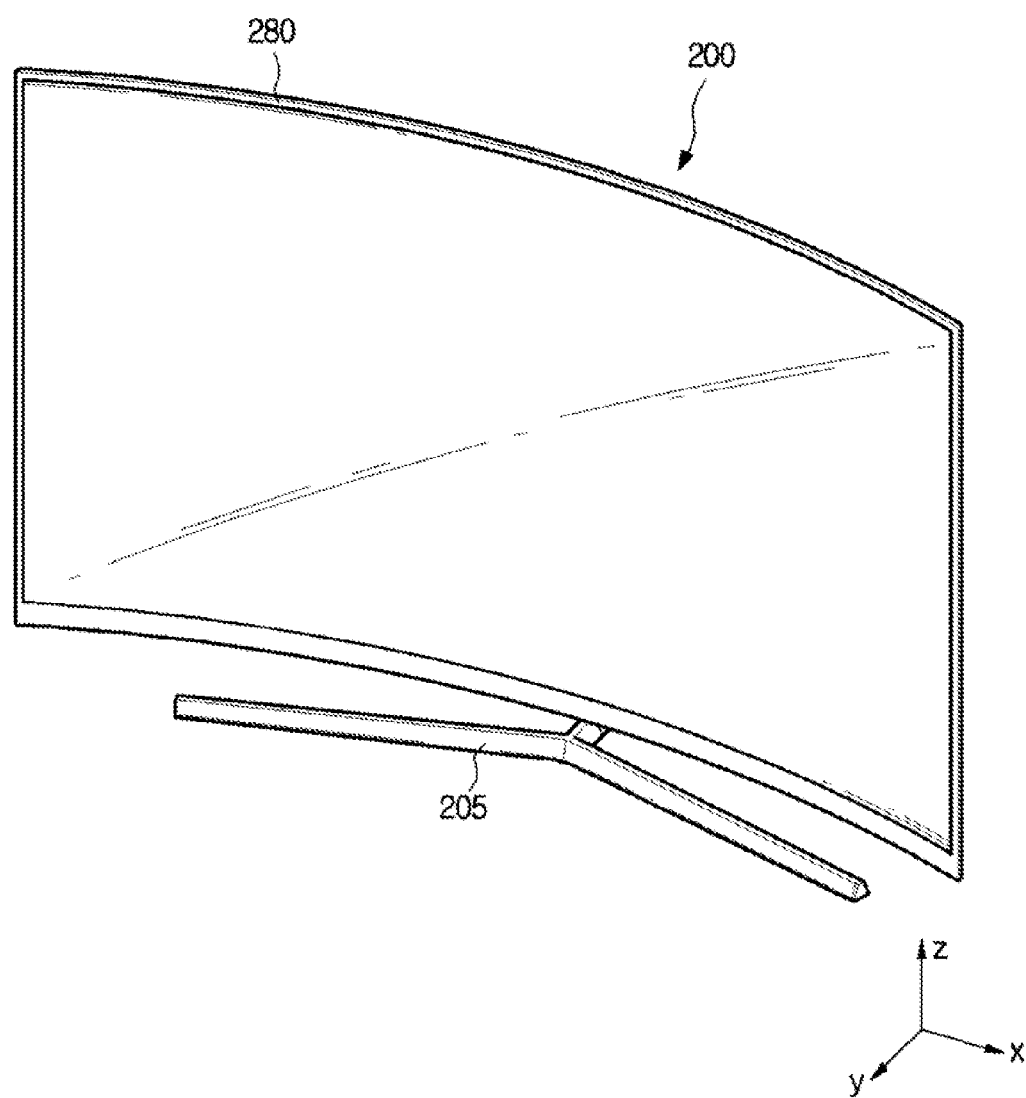
FIGS. 8A and 8B are perspective views illustrating a display unit of a display apparatus according to yet another exemplary embodiment.
Figure 8B:
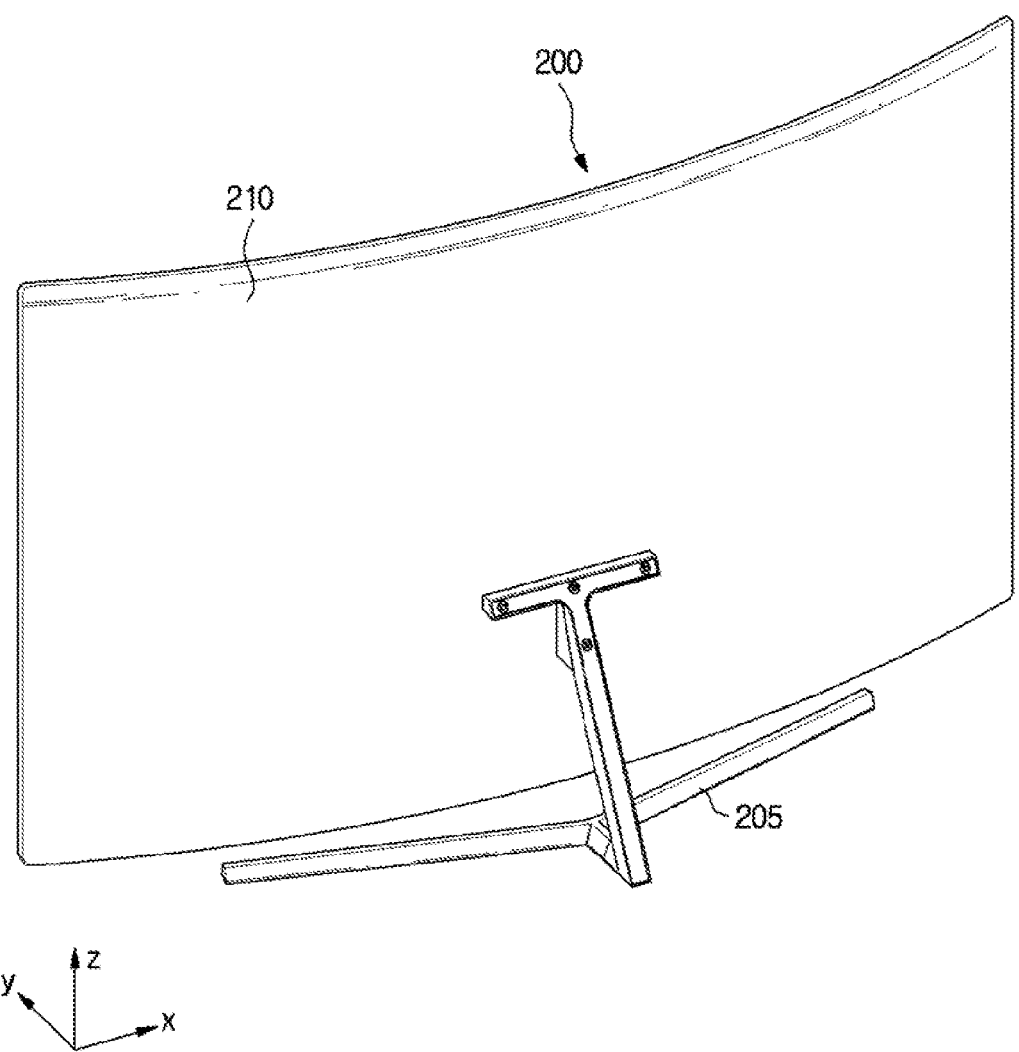

FIGS. 8A and 8B are perspective views illustrating the display unit of the display apparatus according to yet another exemplary embodiment.

A curved display device 200 is shown in FIGS. 8A and 8B. The curved display device 200 may have a curvature. Both sides of the curved display device 200 having a curvature may protrude from the center region on the basis of the screen. For example, the curvature of the curved display device 200 may include 4300R, 4200R, 4000R, 3300R, 3000R or less. The above-mentioned description in which the curvature of the curved display device 200 is gradually reduced (e.g., approximates to 1) in response to slimness of the display device 100 and technical development may be readily appreciated by those skilled in the art.

The curved display device 200 may be implemented as a display panel having a curvature (not shown). In addition, the curved display device 200 may have a flat display panel (not shown), and may be implemented by the chassis units (210, 280) having a curvature capable of supporting the display panel (not shown).

The bottom chassis 210 of the curved display device 200 may have a curved surface. In order to form a curvature of the bottom chassis 210, an intaglio pattern (e.g., a groove (not shown)) may be formed at the front surface (e.g., the surface facing the top chassis). The bottom chassis 210 may have a curvature formed by plastic deformation of the intaglio pattern. A cross-sectional shape of the intaglio pattern (not shown) of the bottom chassis 210 may have a triangular shape, a semicircular shape, or an elliptical shape. The scope or spirit of the intaglio pattern (not shown) of the bottom chassis 210 according to the exemplary embodiment is not limited to the above-mentioned cross-sectional shapes, and any cross-sectional shape capable of forming the curvature of the bottom chassis 210 can be applied to the exemplary embodiment.

The depth of the intaglio pattern (not shown) formed at the front surface of the bottom chassis 210 may be about 70% of the thickness of the bottom chassis 210 or less. The depth of the intaglio pattern (not shown) formed at the front surface of the bottom chassis 210 may be in the range of about 60% to about 65% of the thickness of the bottom chassis 210.

The above-mentioned description in which the depth of the intaglio pattern (not shown) formed at the front surface of the bottom chassis 210 can be changed in response to a material of the bottom chassis 210 may be readily appreciated by those skilled in the art.

Other fabrication methods for forming a curvature of the bottom chassis 210 may include a press working method. The above-mentioned method for forming the curvature of the bottom chassis through such press working needs to consider the size, cost, and fabrication efficiency of the pressing device.

The method for forming the curvature of the curved display device 200 may include a process for forming a curvature not only in the bottom chassis 210 but also in the top chassis 280. In addition, a curvature may also be formed in the light source (not shown), the reflection sheet (not shown), the middle holder (not shown), the optical sheet (not shown), the middle mold (not shown), or the display panel (not shown) as necessary.

The intaglio pattern (not shown) formed at the front surface of the bottom chassis 210 may be formed in the z-axis direction. A total area of the intaglio pattern formed at the front surface of the bottom chassis 210 may be less than a total area of the front surface of the bottom chassis 210. In addition, one or more intaglio patterns (not shown) formed in the z-axis direction may be formed in the x-axis direction (or in the negative (−) x-axis direction).

The bottom chassis 210 may be bent by plastic deformation of the intaglio pattern (not shown) formed at the front surface of the bottom chassis 210, resulting in formation of a curvature in the bottom chassis 210. The spacing distance between the intaglio patterns (not shown) formed at the front surface of the bottom chassis 210 and the cross-sectional shape between the intaglio patterns may be changed in response to the curved display device 200.

As the spacing distance between the intaglio patterns (not shown) formed at the front surface of the bottom chassis 210 is gradually reduced, the curvature of the bottom chassis 210 may be increased in size. In addition, as the depth of the intaglio pattern (not shown) formed at the front surface of the bottom chassis 210 is gradually increased, the curvature of the bottom chassis 210 may be increased in size.

If the same spacing distance between the intaglio patterns (not shown) formed at the front surface of the bottom chassis 210 is achieved, the same curvature of the bottom chassis 210 may be achieved. In addition, if different spacing distances between the intaglio patterns (not shown) formed at the front surface of the bottom chassis 210 are achieved, the bottom chassis 210 may have different curvatures.

If the spacing distance between the intaglio patterns (not shown) formed at the center region of the front surface of the bottom chassis 210 is different from the spacing distance between the intaglio patterns (not shown) formed at both side regions of the bottom chassis 210, a curvature of the center region of the bottom chassis 210 may be different from a curvature of both side regions. For example, if the spacing distance between the intaglio patterns (not shown) formed at the center region of the front surface of the bottom chassis 210 is longer than the spacing distance between the intaglio patterns (not shown) of both side regions of the bottom chassis 210, the curvature of the center region of the bottom chassis 210 may be larger than the curvature of both side regions.

The display device 200 may include a stand 205 for supporting the bottom chassis 210. The stand 205 may be coupled to the rear surface of the bottom chassis 210.

As is apparent from the above description, the exemplary embodiments may provide a display unit, which includes a display panel, a printed circuit board (PCB) configured to generate a drive signal for driving the display panel, and a chip-on-film configured to electrically interconnect the display panel and the PCB, and a display apparatus including the display unit. Here, a concavo-convex shape including a concave region and a convex region may be formed at one side of the PCB.

For the concavo-convex shape formed at one side of the PCB, the exemplary embodiments can provide a display unit facing the display panel and the display apparatus including the display unit.

The display panel, the chip-on-film, and the PCB are electrically interconnected in the order of gravity directions, and are contained in the display unit, such that the exemplary embodiments can provide the display unit and the display apparatus including the same.

In accordance with the display unit and the display apparatus including the same according to the exemplary embodiments, as the PCB height is gradually reduced, a lower bezel of a top chassis is gradually reduced in width, such that the display unit and the display apparatus are also reduced in thickness.

As the spacing distance between the display panel and the upper end of the PCB is gradually reduced in length, the lower bezel of the top chassis is gradually reduced in width, such that the display unit is gradually reduced in thickness and the display apparatus including the display unit can be provided by the exemplary embodiments.

As the spacing distance between the display panel and a concave region of the PCB is gradually reduced in length, the lower bezel of the top chassis is gradually reduced in width, such that the display unit is gradually reduced in thickness and the display apparatus including the display unit can be provided by the exemplary embodiments.

As the spacing distance between the display panel and the lower end of the PCB is gradually reduced in length, the lower bezel of the top chassis is gradually reduced in width, such that the display unit is gradually reduced in thickness and the display apparatus including the display unit can be provided by the exemplary embodiments.

As the junction region between the chip-on-film and the PCB is gradually reduced in height, the lower bezel of the top chassis is gradually reduced in width, such that the display unit is gradually reduced in thickness and the display apparatus including the display unit can be provided by the exemplary embodiments.

The scope or spirit of the present inventive concept is not limited thereto. The exemplary embodiments can also provide other display units, each of which includes a display panel, a printed circuit board (PCB) formed in a concavo-convex shape including a convex region and a concave region, and a chip-on-film electrically interconnecting the display panel and the concave region of the PCB, such that each display unit can be gradually reduced in thickness and the display apparatus including the display unit can be provided by the exemplary embodiments.

Although a few exemplary embodiments have been shown and described, it would be appreciated by those skilled in the art that changes may be made in these exemplary embodiments without departing from the principles and spirit of the present inventive concept, the scope of which is defined in the claims and their equivalents.

What is claimed is:

1. A display unit comprising:
a display panel configured to display a content thereon;
a printed circuit board (PCB) configured to generate a drive signal for driving the display panel; and
a chip-on-film in which a display driver integrated circuit (IC) is mounted, configured to electrically interconnect the display panel and the PCB,
wherein one side of the PCB includes an uneven part including a convex region and a concave region, and the PCB is bonded to the chip-on-film in the concave region,
the printed circuit board (PCB) is lower in height than the chip-on-film, the height being measured in an extension direction in which the display panel, the PCB, and the chip-on-film extend,
the display driver IC is located in the concave region of the PCB,
the display panel, the display driver IC and the PCB are attached to a rear of the chip-on-film when the chip-on-film is extended parallel to the display panel, and
the convex region of the PCB is spaced apart from the display panel.

2. The display unit according to claim 1, wherein the uneven part is arranged to face the display panel.

3. The display unit according to claim 1, wherein the display panel, the chip-on-film, and the printed circuit board (PCB) are connected in order of a gravity direction.

4. The display unit according to claim 1, wherein the concave region of the printed circuit board (PCB) is larger in width than the chip-on-film.

5. The display unit according to claim 1, wherein the concave region of the printed circuit board (PCB) is larger in width the convex region of the printed circuit board (PCB).

6. The display unit according to claim 1, wherein:
the printed circuit board (PCB) includes a plurality of convex regions; and
a width of one convex region is different from a width of another convex region.

7. The display unit according to claim 1, wherein the height of the printed circuit board (PCB) is longer than a spacing distance between the printed circuit board (PCB) and the display panel.

8. The display unit according to claim 1, wherein the concave region of the printed circuit board (PCB) is longer in width than the display driver integrated circuit (IC).

9. The display unit according to claim 1, wherein the height of a junction region between the PCB and the chip-on-film is lower than the height of the PCB.

10. The display unit according to claim 1, wherein the height of a junction region between the PCB and the chip-on-film is higher than the height of the display driver integrated circuit (IC).

11. The display unit according to claim 1, wherein the height of a junction region between the PCB and the chip-on-film is shorter than the spacing distance between the PCB and the display panel.

12. The display unit according to claim 1, wherein each corner of the convex region of the printed circuit board (PCB) is chamfered or rounded.

13. The display unit according to claim 1, wherein each corner at which the concave region of the PCB meets the convex region of the PCB is chamfered or rounded.

14. The display unit according to claim 1, wherein each corner at which the concave region of the PCB meets the convex region of the PCB has an angle of about 60° to about 110°.

15. A display device comprising:
a display unit which includes a display panel configured to display a content thereon, a printed circuit board (PCB) configured to generate a drive signal for driving the display panel, and a chip-on-film in which a display driver integrated circuit (IC) is mounted, configured to electrically interconnect the display panel and the PCB; and
a stand configured to support the display unit,
wherein one side of the PCB includes an uneven part including a convex region and a concave region, and the PCB is bonded to the chip-on-film in the concave region,
the printed circuit board (PCB) is lower in height than the chip-on-film, the height being measured in an extension direction in which the display panel, the PCB, and the chip-on-film extend,
the display driver IC is located in the concave region of the PCB,
the display panel, the display driver IC and the PCB are attached to a rear of the chip-on-film when the chip-on-film is extended parallel to the display panel, and
the convex region of the PCB is spaced apart from the display panel.

16. The display device according to claim 15, wherein the display panel is a curved display panel having a curvature or a flat display panel.

17. The display device according to claim 15, wherein the display unit is a curved display unit having a curvature, or a flat display unit.

18. A display unit comprising:
a display panel;
a printed circuit board (PCB) arranged at one side of the display panel; and
a chip-on-film in which a display driver integrated circuit (IC) is mounted, configured to electrically interconnect the display panel and the printed circuit board (PCB),
wherein one side of the printed circuit board (PCB) arranged to face the one side of the display panel includes a first part, and a second part being spaced farther apart from the display panel than the first part, and the PCB is connected to the chip-on-film at the second part,
the printed circuit board (PCB) is lower in height than the chip-on-film, the height being measured in an extension direction in which the display panel, the PCB, and the chip-on-film extend,
the display driver IC is located in the concave region of the PCB,
the display panel, the display driver IC and the PCB are attached to a rear of the chip-on-film when the chip-on-film is extended parallel to the display panel, and
the second part of the PCB is disconnected from the display panel.

19. A display unit comprising:
a display panel;
a printed circuit board (PCB) having an edge facing an edge of the display panel, at least one portion of the edge of the PCB being cutout to form a cutout region; and
a chip-on-film comprising an integrated circuit (IC) mounted therein, the chip-on-film electrically connecting the PCB to the display panel, and attached such that the IC is positioned within the cutout region of the PCB,
wherein the printed circuit board (PCB) is lower in height than the chip-on-film, the height being measured in an extension direction in which the display panel, the PCB, and the chip-on-film extend,
the display driver IC is located in the concave region of the PCB,
the display panel, the display driver IC and the PCB are attached to a rear of the chip-on-film when the chip-on-film is extended parallel to the display panel, and
a region between the cutout region of the PCB is disconnected from the display panel.

20. The display unit of claim 19, wherein a combined thickness of the chip-on-film and the IC is equal to or less than a thickness of the PCB.

* * * * *